United States Patent [19]
Anderbouhr et al.

[11] Patent Number: 6,040,012
[45] Date of Patent: Mar. 21, 2000

[54] PROCESS FOR THE PREPARATION BY CHEMICAL VAPOR DEPOSITION (CVD) OF A TI-Al-N BASED MULTILAYER COATING

[75] Inventors: Stéphanie Anderbouhr, Grenoble; Frédéric Schuster, Lans en Veacors; Elisabeth Blanquet, Claix; Gérald Theret, Grenoble, all of France

[73] Assignee: Commissariat a L'Energie Atomique, Paris, France

[21] Appl. No.: 09/132,992

[22] Filed: Aug. 12, 1998

[30]     Foreign Application Priority Data

Aug. 29, 1997 [FR] France ................................. 97 10801

[51] Int. Cl.$^7$ .................................................. C23C 16/34
[52] U.S. Cl. ............................ 427/255.391; 427/255.394; 427/255.7
[58] Field of Search ..................... 427/255.391, 255.394, 427/255.7

[56]                  References Cited

U.S. PATENT DOCUMENTS 4,699,082  10/1987  Hakim ..................................... 118/716
5,679,448  10/1997  Kawata ................................... 428/216

FOREIGN PATENT DOCUMENTS

| 0 117 542 | 9/1984 | European Pat. Off. . |
|---|---|---|
| 709483 | 1/1996 | European Pat. Off. . |
| 0 709 483 | 5/1996 | European Pat. Off. . |
| 2745299 | 8/1997 | France . |
| 44 08 250 | 1/1995 | Germany . |
| WO 90/11858 | 10/1990 | WIPO . |

OTHER PUBLICATIONS

Sang–Hyeob Lee, et al., J. Vac. Sci. Technology, vol. 13, No. 4, pp. 2030–2034, "Compositionally Gradient $(TI_{1-x}AL_x)N$ Coatings Made by Plasma Enhanced Chemical Vapor Deposition", Jul./Aug. 1995.

C. Jimenez, et al., Surface and Coatings Technology, vol. 76–77, pp. 237–243, "Deposition of TiN Thin Films by Organometallic Chemical Vapor Deposition: Thermodynamical Predictions and Experimental Results", 1995 (no month).

Sang–Hyeob Lee, et al., J. Vac. Sci. Technology, vol. A12, No. 4, pp. 1602–1607, "$(Ti_{1-x}Al_x)N$ Coatings by Plasma–Enhanced Chemical Vapor Deposition", Jul./Aug. 1994.

Kwang Ho Kim, et al., Thin Solid Films, vol. 283, pp. 165–170, "Comparative Studies of TiN and $Ti_{1-x}Al_xN$ by Plasma–Assisted Chemical Vapor Deposition using a $TiCl_4/AlCl_3/N_2/H_2/Ar$ GAS Mixture", 1996, (no month).

S. Gilles, et al., ICMCTF Conference, pp. 1–18, "Deposition of (Ti, Al)N Thin Films by Organometallic Chemical Vapor Deposition: Thermodynamic Predictions and Experimental Results", May 1997.

N. Thomas, et al., Journal of the Electrochemical Society, vol. 140, No. 2, pp. 475–484, "LPCVD $WSi_2$ Films using Tungsten Chlorides and Silane", Feb. 1993.

*Primary Examiner*—Timothy Meeks
*Attorney, Agent, or Firm*—Oblon, Spivak, McClelland, Maier & Neustadt, P.C.

[57]                  ABSTRACT

The invention relates to a process for the preparation of a multilayer coating, comprising a stack, on a substrate, of several layers chosen from among layers constituting by TiN and layers constituted by (Ti,Al)N, also known as $Ti_{1-x}Al_xN$, the entire coating being produced in a single, continuous operation by thermal chemical vapour deposition (CVD) from a gaseous mixture comprising a reducing gas, such as ammonia or nitrogen, hydrogen and titanium and optionally aluminium chlorides, the nature and/or composition of each deposited layer being instantaneously adjusted by modifying the reducing gas to hydrogen molar ratio in the gaseous mixture. The invention also relates to multilayer coatings comprising (Ti,Al)N layers of variable compositions and in particular with composition gradient. Application to wear-resistant or abrasion-proof coatings having a resistance to oxidation and corrosion, particularly at high temperatures.

13 Claims, 2 Drawing Sheets

PROCESS FOR THE PREPARATION BY CHEMICAL VAPOR DEPOSITION (CVD) OF A TI-A1-N BASED MULTILAYER COATING

BACKGROUND OF THE INVENTION

The present invention relates to a process for preparing by chemical vapour deposition or CVD of a multilayer coating based on Ti—Al—N, i.e. a multilayer coating of TiN and $Ti_{1-x}Al_xN$, in which e.g. the $Ti_{1-x}Al_xN$ layers can have variable compositions. The invention also relates to the coating prepared by this process.

More specifically, the present invention relates to a process for the preparation of a multilayer coating, comprising a stack, on a substrate, of several layers chosen from among layers constituted by TiN and layers constituted by (Ti,Al)N, also known as $Ti_{1-x}Al_xN$, the complete coating being produced in a single, continuous operation by thermal chemical vapour deposition (CVD) from a gaseous mixture comprising a reducing gas, such as ammonia or nitrogen, hydrogen and titanium and optionally aluminium chlorides, the nature and/or composition of each layer being instantaneously adjusted by modifying the reducing gas to hydrogen molar ratio in the gaseous mixture.

The technical field of the invention can be generally defined as that of the deposition of thin layers or films on substrates with a view to improving their properties.

DESCRIPTION OF THE BACKGROUND

Nitride-type ceramics have long been used in numerous industrial applications, particularly due to their excellent resistance to corrosion and abrasion.

Among ceramics of the nitride type, titanium nitride (TiN) is particularly interesting as a result of its attractive mechanical characteristics, namely a low friction coefficient, a good resistance to abrasion and a high hardness, represented by a Knoop hardness, of approximately 1400.

Therefore titanium nitride has long been used for the surface coating of substrates, particularly cutting tools and in particular steel cutting tools operating at high speeds, in order to increase their resistance to wear.

However, such titanium nitride deposits suffer from the important disadvantage of oxidizing, e.g. in ambient air, as from 673 K, which excludes the use of such deposits at high temperatures.

Much research has been carried out on more complex titanium nitrides and it has been found that the insertion of aluminium in the cubic lattice of titanium nitride (TiN) led to a significant increase in the oxidation resistance. Thus, on the surface aluminium titanium nitride, also known as titanium nitride, formation takes place of aluminium (Ti,Al)N or $Ti_{1-x}Al_xN$, a thin, amorphous, protecting alumina layer preserving the hard coating from any supplementary oxidation and therefore increasing the period of use of the coated tool.

It has been revealed that such a result does not occur during mixed TiN and AlN deposits.

With regards to the preparation processes, the processes used for TiN layer deposits, are essentially physical vapour deposition (PVC) processes, such as arc cathodic sputtering or reactive sputtering.

Physical vapour deposition is particularly appropriate for the deposition of titanium nitride on substrates, such as steel tools, because the treatment temperature must not exceed 750° C., above which there is generally a steel phase transformation.

More recently, TiN films have been deposited by chemical vapour deposition using metal chloride-type precursors, which are decomposed at high temperatures. This process is generally known as thermal CVD or LPCVD when operating at low pressures.

Another chemical vapour deposition method for titanium nitride films is organometallic chemical vapour deposition (OMCVD), which is generally performed at a low pressure, when it is known as low pressure organometallic chemical vapour deposition (LPOMCVD).

The use of organometallic precursors in place of metal chloride-type precursors used in conventional, thermal chemical vapour deposition processes makes it possible to significantly reduce the reaction temperature, which e.g. passes from 873 K with chlorides, to 673 K and even 473 K with organometallic compounds.

Thus, the document by C. JIMENEZ, S. Gilles, C. BERNARD and R. MADAR "Deposition of TiN Thin Films by Organometallic Chemical Vapour Deposition : Thermodynamical Predictions and Experimental Results", Surface and Coatings Technology, 76–77, 1995, pp 237–243 describes the low pressure deposition of pure titanium nitride films from tetrakis-dimethylamino-titanium $(Ti(N(CH_3)_2)_4)$, as the precursor and $NH_3$.

TiN layers have also been deposited by plasma assisted chemical vapour deposition (PACVD) or plasma enhanced chemical vapour deposition (PECVD), which also permit a relatively low temperature treatment. However, such a process is also difficult to carry out and does not permit the coating of parts having complex geometries.

Coatings of (Ti,Al)N or $Ti_{1-x}Al_xN$ are mainly prepared by physical vapour deposition processes in connection with the preparation of TiN coatings. These processes suffer from certain disadvantages, essentially linked with the difficulty of uniformly coating substrates and parts having complex shapes, as well as the complexity of performance and preparation of PVD targets.

Attempts have therefore been made to prepare (Ti,Al)N or $Ti_{1-x}Al_xN$ coatings by chemical vapour deposition processes, such as thermal CVD, PACVD or OMCVD processes, which have the advantage of permitting the uniform coating of parts having complex geometries, as well as a better control of the stoichiometry of the layers.

Thus, the document by S. H. LEE, H. J. RYOO and J. J. LEE, J. Vac. Sci. Technol., A12(4), 1994, p 1602 relates to the preparation of $Ti_{1-x}Al_xN$ monolayer coatings having a fixed composition by PACVD, using a gaseous mixture of $TiCl_4$, $AlCl_3$, $NH_3$, hydrogen and argon.

The document of K. H. Kim and S. H. Lee, Thin Solid Films, 283, 1996, pp 165–170 describes the preparation of $Ti_{1-x}Al_xN$ monolayer coatings having a fixed composition on steel and silicon substrates by PACVD, using a gaseous mixture identical to that of the preceding document, but in which the ammonia is replaced by nitrogen.

The document of S. GILLES, N. BOURHILA, S. IKEDA, C. BERNARD and R. MADAR, ICMCTF, May 1997, ICMCTF Conference, San Diego, describes the deposition of thin monolayers of aluminium titanium nitride (Ti,Al)N or $Ti_{1-x}Al_xN$ by chemical vapour deposition using organometallic precursors (OMCVD) from a gas containing ammonia and, as metal precursors, tetrakis dimethylamino titanium $Ti(N(CH_3)_2)_4$ and hexakis dimethylamido dialuminium $Al_2(N(CH_3)_2)_6$.

It is pointed out that the variation of the ammonia flow rate can lead to an increase in the aluminium proportion in the deposited aluminium titanium nitride, but this document only describes the preparation of monolayer coatings having a clearly defined composition.

None of the aforementioned documents mentions or intimates the preparation of coatings formed by a multilayer stack of TiN and/or (Ti,Al)N.

However, it is known that multilayer coatings comprising a stack of TiN and/or (Ti,Al)N layers can be produced, but solely by physical vapour deposition (PVD).

This is in particular the case with the abrasion-proof multilayer coating marketed under the name "BALINIT FUTURA" by BALZERS, whose main application is the field of implements and tools.

Apart from the aforementioned deficiencies in the case of the deposition of monolayer coatings and inherent in the physical vapour deposition process, the performance of the PVD process for preparing a multilayer coating suffers from the disadvantage of a considerable rigidity, because the PVD targets have a fixed composition.

It is consequently impossible, in a single operation, to deposit several layers of different natures (AlN and (Al,Ti)N), because it is necessary to on each occasion change the target and stop the process for performing the deposition of another layer and/or move the substrate from one deposition enclosure to another, so that the complexity and volume of the installations is increased and the time necessary for depositing a multilayer coating rises considerably.

PVD deposition can only permit e.g. the deposition of a coating having an alternation of TiN and (Ti,Al)N layers, the (Ti,Al)N layers having on each occasion the same composition, i.e. the same aluminium proportion, it not being possible to vary the aluminium proportion from one (Al,Ti)N layer to the next, because on each occasion this would lead to the preparation and installation of a different target.

Due to the limiting flexibility of such a process, applications remain very limited, because an installation can only be used within the framework of the depositing of a very specific coating and requires long and costly adaptation and modification operations to permit use for the depositing of another coating, which differs by the nature and/or composition of a layer.

Thus, there is an as yet unsatisfied need for a process for the preparation of a multilayer coating comprising a stack of several layers chosen from among layers constituted by TiN and $Ti_{1-x}Al_xN$ and which, inter alia, is easy to implement, requires a reduced number of operations, which has a considerable flexibility of use, which makes it possible to prepare with reduced adaptation operations a considerable variety of coatings differing by their nature and/or composition and/or succession of the deposited layers and which finally gives coatings having excellent mechanical and corrosion resistance properties and which have perfectly defined compositions.

This process must also permit a uniform coating, which has a clearly controlled thickness, no matter what the geometry of the substrate.

Therefore the object of the invention is to supply a process for the preparation of a multilayer coating comprising a stack, on a substrate, of several layers chosen from among layers constituted by TiN and $Ti_{1-x}Al_xN$ (or (Ti,Al)N), which does not suffer from the deficiencies, disadvantages and limitations of the prior art processes, which provides a solution to the problems caused by the prior art processes and which responds, inter alia, to the aforementioned needs.

SUMMARY OF THE INVENTION

This object and others are achieved, according to the invention, by a process for the preparation of a multilayer coating, comprising a stack, on a substrate, of several layers chosen from among layers constituted by titanium nitride TiN and layers constituted by aluminium titanium nitride $Ti_{1-x}Al_xN$ (or (Ti,Al)N), characterized in that said coating is deposited continuously and in a single operation by thermal chemical vapour deposition (thermal CVD) from a gaseous mixture comprising a reducing gas, hydrogen and as precursors, titanium and optionally aluminium chlorides obtained from a single target or charge of titanium and aluminium alloy, the nature and/or composition of each deposited layer being instantaneously adjusted during the deposition operation by modifying the reducing gas to hydrogen molar ratio in the gaseous mixture.

The deposition process according to the invention is simple, easy to perform and has a considerable flexibility. The thermal CVD process according to the invention completely obviates the disadvantages of the PVD process.

The deposition of an even very complex, multilayer coating, which can involve a complex succession of a very large number of layers having a different nature and/or composition is possible, according to the invention, by chemical vapour deposition in a single, continuous operation, without stopping, without carrying out a charge (target change) and/or without the transfer of the coated substrate from one enclosure to another, as is the case in the known processes using PVD.

According to the invention, unlike in PVD processes, it is possible during CVD, without having recourse to any complicated and cumbersome adaptation operation and without stopping said process, to instantaneously adjust at random and permanently, the nature and/or composition of each deposited layer by simply acting on the reducing gas to hydrogen molar ratio in the gaseous mixture, whilst also retaining a single aluminium and titanium alloy source throughout the deposition operation.

Thus, according to the invention, by simply acting on the reducing gas to hydrogen molar ratio, i.e. on the molar quantity of reducing gas and in particular on its flow rate, to modify and choose the nature of each deposited layer, without stopping the deposition operation, i.e. it is possible to proceed in such a way that the deposited layer is pure TiN or (Ti,Al)N without it being necessary to change the target or charge.

The reducing gas is generally ammonia or nitrogen.

The reducing gas to hydrogen molar ratio in the gaseous mixture is generally 0.01 to 1.

It is also possible to precisely choose, by adjusting the reducing gas to hydrogen molar ratio or the reducing gas quantity, the composition of each (Ti,Al)N or $Ti_{1-x}Al_xN$ layer throughout the complete range of possible values for the aluminium proportion defined by the value x, the target remaining the same as for the deposition of TiN layers.

For example, the aluminium proportion in the aluminium titanium nitride can vary from 0 to 60%.

In the same way, it is possible to proceed in such a way that all the (Ti,Al)N layers have the same composition (even Ti:Al ratio), or it is possible to choose one or several of these layers, when the coating has two or more, to have compositions differing from one another, whereby this can be performed immediately by simply modifying the reducing gas to hydrogen molar ratio or the reducing gas quantity.

According to a particularly advantageous aspect of the invention, it is also possible, during deposition, to modify the composition of each $Ti_{1-x}Al_xN$ layer deposited, in order to e.g. obtain a composition gradient layer, whose composition generally varies progressively and continuously throughout its thickness, from a composition e.g. corresponding to a pure TiN layer to a layer having a very high aluminium content (whereof the value of x is very high, e.g. 0.6).

As a result of the process according to the invention, the composition and nature of each layer can be controlled with great accuracy. Thus, the coatings prepared also have perfectly controlled properties.

The process according to the invention can be easily adapted to the preparation of a particular coating for a particular operation, so that it makes it possible to prepare all types of coatings having very varied physicochemical and mechanical properties suitable for a wide range of applications, which were not hitherto envisaged for coatings of this type.

Thus, the process according to the invention considerably widens the field of potential applications for multilayer coatings of titanium nitride and aluminium titanium nitride.

The invention also relates to multilayer coatings prepared by the aforementioned process. The invention includes all coatings which can be prepared by the above process, no matter what their nature, composition, succession and number of deposited layers.

The invention also relates to novel multilayer coatings, which have not hitherto been prepared. These are multilayer coatings comprising a stack of several layers chosen from among layers constituted by TiN and layers constituted by (Ti,Al)N, which also comprise at least one composition gradient (Ti,Al)N layer.

The process according to the invention also makes it possible to prepare the multilayer coatings indicated hereinafter.

These are multilayer coatings comprising a stack of several layers chosen from among layers constituted by TiN and $Ti_{1-x}Al_xN$ (or (Ti,Al)N) and which comprise at least two $Ti_{1-x}Al_xN$ layers, at least one of said $Ti_{1-x}Al_xN$ layers having a composition differing from the other $Ti_{1-x}Al_xN$ layer or layers.

Preferably, in this case, at least one of the $Ti_{1-x}Al_xN$ layers is a composition gradient layer.

Preferably, the TiN and $Ti_{1-x}Al_xN$ layers alternate, but the coating may also incorporate a stack of layers constituted solely by $Ti_{1-x}Al_xN$, each layer having a different composition (compared with the preceding and following layers), or layers e.g. having in pairs identical compositions, i.e. the "odd" layers have one defined composition and the "even" layers another defined composition.

BRIED DESCRIPTION OF THE DRAWINGS

Other features and advantages of the invention can be gathered from studying the following description given in an illustrative, but non-limitative manner and with reference to the attached drawings, wherein show:

FIG. 1 A diagrammatic sectional view of an apparatus permitting the preparation of multilayer coatings according to the invention.

FIG. 2 An example (example 6) of a production sequence for a TiN, (Ti,Al)N multilayer deposit in the form of a graph, where on the abscissa is plotted the time in minutes and on the ordinate the $NH_3/H_2$ molar ratio in the gaseous mixture.

DETAILED DESCRIPTION OF THE INVENTION

Figure 1:
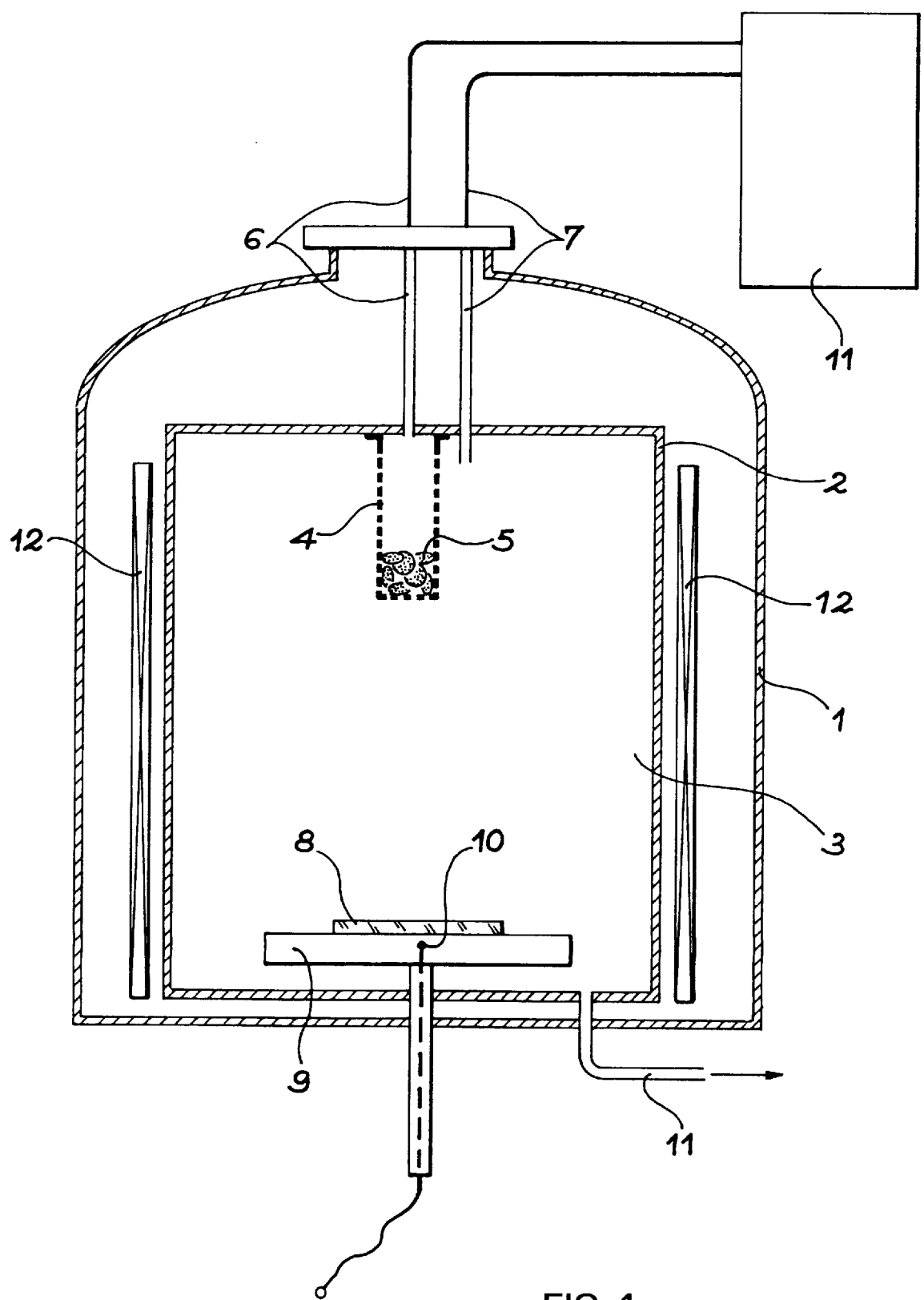

The process according to the invention more specifically comprises, e.g. the following succession of stages, which are conventional stages in thermal CVD processes for the deposition of a coating layer.

The first stage consists of the in situ formation of titanium and aluminium metal chloride starting from a charge, in the case of the process according to the invention a single charge, of titanium and aluminium alloy.

The titanium and aluminium alloy used is preferably an alloy of the Ti—Al type in solid form, but it is also possible to use other alloys such as $TiAl_2$, $TiAl_3$.

The titanium and aluminium alloy is generally used in the form of bars or chips, because such a form aids chlorination.

The chlorination operation is generally performed using gaseous chlorine, preferably diluted with a gas diluting a vector gas such as argon e.g. in a proportion $Cl_2/Ar=1/2$.

The titanium and aluminium alloy is preferably raised to a temperature of 973 to 1173 K and chlorination generally takes place at a pressure of $10^2$ to $10^5$ Pa.

The $Cl_2$ quantity is preferably chosen so as to obtain a total chlorination of the alloy, so that in the case of a TiAl alloy, the metal is generally in excess compared with the chlorine.

For example, for a metal quantity of 10 moles, the chlorine quantity is preferably 1 mole, the gaseous phase then being mainly constituted by $AlCl_3$ and $TiCl_3$, in the case of a preferred temperature of 1023 K and a pressure of 1130 Pa, and the molar quantity of $AlCl_3$ produced is five to ten times higher than the $TiCl_3$ quantity.

The second stage consists of mixing the gaseous products resulting from the chlorination with the reducing gas, hydrogen and optionally a vector or carrier gas chosen from among argon, helium and mixtures thereof.

The reducing gas is preferably chosen from among nitrogen and ammonia, ammonia being preferred. The mixing operation is generally performed at a temperature of 523 to 773 K.

According to the invention, it is possible to vary the composition of the deposited layers by simply acting on the reducing gas, e.g. $NH_3$, to hydrogen molar ratio in the gaseous mixture.

It would appear that an increase of the reducing gas, e.g. $NH_3$, to hydrogen molar ratio makes it possible to increase the aluminium proportion compared with the titanium in the deposited layer.

In the case where the hydrogen quantity and consequently its flow rate is constant, it is then also possible to refer simply to the molar quantity of reducing gas, such as $NH_3$, in the mixture, whose increase increases the aluminium proportion. If the $H_2$ flow rate is constant, it is easy to increase the Al proportion by raising the reducing gas flow rate.

The reducing gas to hydrogen, e.g. $NH_3/H_2$ molar ratio in the gaseous mixture can e.g. vary from 0.01 to 1. For example, for a molar ratio of approximately 0.01, preparation takes place of pure TiN, whereas for molar ratios of 0.02 to 0.1, preparation takes place of aluminium titanium nitrides with x e.g. varying from 5 to 60.

Without wishing to be bound by any theory, it would appear that an increase in the reducing gas concentration, e.g. of $NH_3$, aids the decomposition of the aluminium chlorides and consequently increases the deposited aluminium nitride quantity.

In the gaseous mixture, the molar quantity of reducing gas, e.g. $NH_3$, and the molar quantity of hydrogen, are both generally in excess compared with the molar quantity of generated aluminium and titanium chlorides. For example, the molar quantity of reducing gas, such as $NH_3$ exceeds and preferably significantly exceeds the molar chloride quantity, whilst the molar hydrogen quantity is at least twice, preferably at least three times and better still at least five times higher than the molar chloride quantity.

Following the mixing of the products resulting from the chlorination with reducing gas, hydrogen and optionally vector gas, such as argon, the actual deposition phase takes place, by reacting the elements present in the gaseous phase with the hot surface of the substrate to be coated, in accordance with the principle generally used in thermal chemical vapour deposition.

The substrate or substrates which can be coated by the process according to the invention are preferably metal substrates, such as steel substrates, e.g. stainless steel or carbon steel substrates.

However, it is also possible to coat in accordance with the process of the invention substrates of other materials such as silicon substrates, e.g. <110>or <100>monocrystalline silicon substrates.

The substrate can be in a random form, but it is preferably constituted by finished, machined parts, e.g. parts forming part of cutting or other tools.

In the same way, it is possible to only coat part of the substrate surface, another part being left uncoated, or coated with a deposit of a different nature.

The temperature to which the substrate is raised is preferably 700 to 1400 K, in more preferred manner 873 to 1073 K, e.g. 973 K and deposition generally takes place at a pressure of 10 to 10 Pa, e.g. 1130 Pa (10 Torr).

The deposition rate is dependent on the parameters of the process and the nature of the substrate and is generally 0.1 to 10 and preferably 0.5 to 5 $\mu$m/h.

As a result of the fact that the entire multilayer deposition can take place in a single, continuous operation without stopping and without changing the target, the total deposition time for the process according to the invention, which is e.g. 15 minutes to 2 hours, is well below the time used for depositing a multilayer coating by PVD, which is generally ten to several dozen hours, as a result of the stoppages occurring between the deposition of each layer, and also without taking account of the time necessary for preparing PVD targets. This reduced deposition time constitutes one of the supplementary advantages of the process according to the invention.

As stated hereinbefore, the nature, composition, succession and number of deposited layers are variable.

The fundamental feature of the process is to permit, without changing the target, in a single enclosure and in continuous manner, the deposition of either pure TiN layers, or $Ti_{1-x}Al_xN$ layers, whereby the (Ti,Al)N layers can have mutually differing compositions and can also have a composition gradient, which can be of a random nature.

The succession of layers can vary, i.e. TiN layers can e.g. alternate with (Ti,Al)N layers, each of the (Ti,Al)N layers having the same composition or one or more (Ti,Al)N layers having a composition different from the other (Ti,Al)N layers.

The stack of layers may also only contain (Ti,Al)N layers, each layer having a different composition from the following and preceding layers in the stack.

As an example of a coating, reference can be made to a two-layer coating comprising on the substrate a TiN layer, then a (Ti,Al)N layer, whereof the Al proportion can be of a random nature, or a two-layer coating formed by a (Ti,Al)N layer on the substrate, followed by another (Ti, Al)N layer having a different composition from the first.

The number of deposited layers is generally two to a few hundred, e.g. 2 to 1000, preferably 10 to 500 and more preferably 50 to 100 or 200.

The thickness of each deposited layer is generally 0.02 to 0.5 $\mu$m. The total thickness of the coating is generally 1 to 50 $\mu$m. This thickness is more particularly dependent on the sought application.

Thus, for mechanical applications, e.g. for protecting a tool against scratches, preference is given to the use of a thickness of 2 to 5 $\mu$m, whereas in applications for giving protection against corrosion by liquid metals, a thickness of approximately 10 $\mu$m is preferably used.

According to a particularly advantageous embodiment of the invention, it is possible to associate a thermochemical treatment, such as a thermal or ionic nitriding, or a carburization with the thermal CVD process according to the invention.

The thermomechanical treatment and the deposition of a coating by thermal CVD can be performed successively in the same installation, e.g. in the enclosure where deposition has taken place, without any intermediate venting of the substrates.

The thermomechanical treatment can be performed prior to the deposition, in order to given an excellent adhesion to the coating and obtain a better, overall mechanical behaviour by a layer hardening effect, or can take place in the final phase, which gives a supplementary protection to the coating.

FIG. 1 very diagrammatically shows an example of a reactor suitable for performing the process according to the invention.

Such a reactor, accompanied by a few modifications, is substantially identical to the reactor described in the document by N. THOMAS, P. SURYANARAYANA, E. BLANQUET, C. VAHLAS, R. MADAR and C. BERNARD, Journal of the Electrochemical Society, 240, 1993, p 475.

According to FIG. 1, the reactor 1 comprises a chemical vapour deposition enclosure 2 having a deposition chamber 3 making it possible to treat the substrate or substrates at the desired temperature, and a chlorination chamber 4 or intermediate chamber in which is placed an aluminium and titanium alloy 5 in solid form, the chlorination chamber e.g. being in the form of a tube sealed by a perforated base, which is supplied with chlorine by the pipe 6.

A not shown mixing zone is also provided for receiving the products resulting from the chlorination process and hydrogen, reducing gas, such as ammonia, and optionally a carrier gas such as argon, which are preferably laterally injected via the pipe 7.

In the deposition chamber, the substrate 8 is placed on an adequate support 9, which can e.g. be a susceptor in the case of induction heating. This support is connected to a thermocouple 10 permitting the permanent measurement of the substrate temperature.

A dry pumping unit with a maximum flow rate of e.g. 300 $m^3$/h is connected to the upper part of the reaction chamber by the pipe 11 and makes it possible to bring about and maintain the desired pressure within the enclosure.

The reactor is also equipped with gas supply means, e.g. in the form of a "gas panel" 11 equipped with a minimum of 5 lines, comprising a switchboard having a ventilation orifice for the chlorine gases.

The switchboard has total pressure, gas flow and pumping control valves, the measurement of the pressure being supplied by a capacitive gauge and it is kept constant by controlling the total flow rate of the gases.

Each gas line and in particular that of the reducing gas, such as $NH_3$, is equipped with an electronically controlled mass flowmeter and a stop valve, which are connected to the switchboard equipped with display means for the flow rate and simultaneous regulation. It is therefore possible to act at random and in instantaneous manner during the process on the gas flow rates, particularly the reducing gas, e.g. $NH_3$, and consequently on the nature and composition of the deposited layers.

The reactor also incorporates heating and temperature regulating means making it possible to reach and maintain the chlorination and deposition temperatures.

In the reactor shown in FIG. 1, the heating means 12 are resistive means and can be in the form of a series of resistors running along the enclosure wall and temperature regulated by controlling the electric power dissipated in the resistors.

It is obvious that the heating means can be in any random form, e.g. the heating of the deposition chamber and the substrate can be inductive heating obtained through the heating of the substrate by means of a susceptor activated by induction coils surrounding the deposition chamber.

The deposition and chlorination chambers can be heated with the same heating means and separate, inductive or resistive heating means can be provided for heating each of the chambers.

The coatings according to the invention can be used in all fields where titanium nitride-based coatings are employed, e.g. in the tool and implement field and more specifically for (Ti,Al)N, in high temperature oxidation protection applications and in applications for protecting against corrosion by liquid metals, e.g. liquid aluminium and its alloys, or liquid uranium and its alloys, such as uranium-iron.

The following examples illustrate the process according to the invention in a non-limitative manner.

EXAMPLE 1

This example illustrates the conditions making it possible to obtain a pure titanium nitride deposit on various substrates.

The apparatus used is substantially identical to that of FIG. 1.

The process parameters are as follows:

| | |
|---|---|
| Chlorination temperature: | 1023 K |
| Deposition temperature: | 973 K |
| Total pressure: | 1130 Pa (10 Torr) |
| Gas flow rates: | $Cl_2$: 5 |
| ($cm^3$/min) | $NH_3$: 3 |
| | $H_2$: 340 |
| | Ar: 640 |
| | Ar diluting $Cl_2$: 10 |
| Substrates: | Steel (type 30CD4) |
| | Stainless steel (type Z150CDV12) |
| | <100>oriented silicon. |

A deposition rate of approximately 0.2 to 2 μm/h is obtained, as a function of the substrates used, i.e. 0.2 μm/h for a steel substrate and 2 μm/h for <110>Si.

Using the aforementioned operating conditions, the deposit is constituted by pure titanium nitride.

The nature of the deposit was determined by X-ray diffraction.

The thicknesses of the deposits were determined by observation with the scanning electron microscope (SEM) of metallographic sections of the specimens and were found in a range from 200 Å for steel to 2 μm for silicon, under the aforementioned deposition conditions.

EXAMPLE 2

This example illustrates the conditions making it possible to obtain an aluminium titanium nitride deposit ((Ti,Al)N or $Ti_{1-x}Al_xN$ on various substrates. The process parameters are as follows:

| | |
|---|---|
| Total pressure: | 1130 Pa (10 Torr) |
| Gas flow rates: | $Cl_2$: 5 |
| ($cm^3$/min) | $NH_3$: 5 |
| | $H_2$: 155 |
| | Ar: 650 |
| | Ar diluting $Cl_2$: 10 |
| Substrates: | identical to those of example 1. |

A deposition rate of 1 to 5 μm/h is obtained, as a function of the substrates used, i.e. 1 μm/h for the steel substrate and 5 μm/h for silicon.

Using the aforementioned operating parameters, the deposit is constituted by aluminium titanium nitride (Ti, Al)N or $Ti_{1-x}Al_xN$ having a Ti:Al ratio of a clearly defined nature and being 0.48/0.52.

The thicknesses of the deposits are 1 to 5 μm, as a function of the substrate types (respectively for steel and Si).

The nature and thickness of the deposits were determined in the same way as in example 1 and the Ti:Al ratios were determined by energy dispersive spectroscopy (EDS) analysis.

Examples 1 and 2 reveal the influence of different experimental parameters and in particular the influence of the molar quantity of $NH_3$ on the nature and composition of the layers.

By increasing the $NH_3$ quantity, e.g. passing from a flow rate of 3 to 5 $cm^3$/min, it is possible to obtain a deposit of a different nature, either of titanium nitride, or of aluminium titanium nitride, the latter having a clearly defined composition.

EXAMPLES 3 to 5

In these examples deposits took place on steel, stainless steel and silicon substrates, in an identical manner to example 2. The parameters are the same as for example 2, except that for the deposit use was made of different $NH_3$ quantities, with respective flow rates of 4.5, 10 and 15 $cm^3$/min.

The aluminium percentage of the layers, as a function of the ammonia flow rate was determined by EDS and is indicated in table I.

TABLE I

| Example | Ammonia flow rate ($cm^3$/min) | Aluminium percentage |
|---|---|---|
| 1 | 3 | 0 |
| 2 | 4.5 | 45 |
| 3 | 5 | 52 |
| 4 | 10 | 58 |

TABLE I-continued

| Example | Ammonia flow rate (cm³/min) | Aluminium percentage |
|---|---|---|
| 5 | 15 | 60 |

Table I clearly demonstrates that the increase in the $NH_3$ quantity makes it possible to increase the aluminium proportion compared with the titanium proportion in the deposit. Thus, for ammonia flow rates varying from 3 to 15 cm³/min, the aluminium percentage fluctuates from 0 to 60%.

EXAMPLE 6

This example illustrates the preparation of a multilayer coating according to the invention on a steel, stainless steel or silicon substrate.

The apparatus used for the deposit is substantially identical to that shown in FIG. 1.

Computer control of the gaseous flow rates and in particular a precise control of the $NH_3$ flow makes it possible to obtain a stack of successive layers of (Ti,Al)N having a variable composition and/or TiN.

Figure 2:
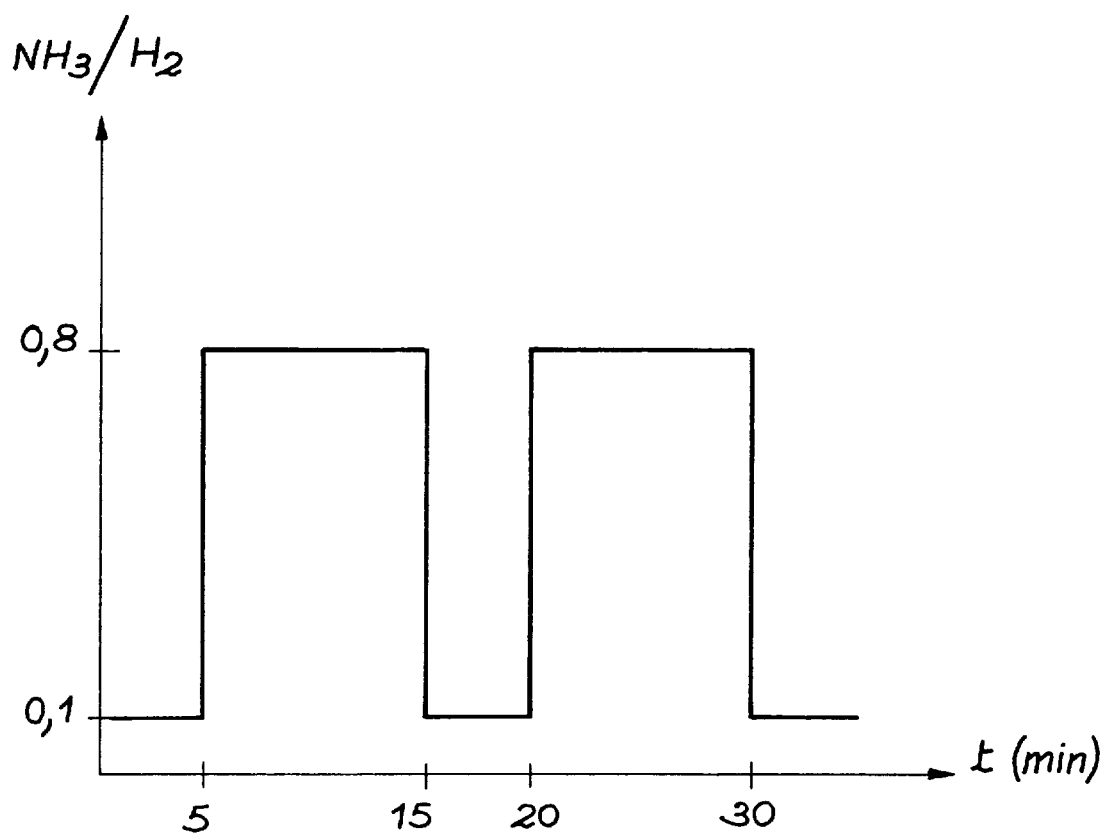

The production sequence of such a coating is shown in FIG. 2, which is a graph, where the time in minutes is plotted on the abscissa and the $NH_3:H_2$ molar ratio on the ordinate.

In the first phase of the deposition lasting five minutes, the $NH_3:H_2$ molar ratio is fixed at 0.1 and a pure, 0.2 µm thick TiN layer is formed and then, in the second phase, the charge, target or source remaining identical, there is rapid rise in the ammonia flow rate, in order to give a $NH_3:H_2$ molar ratio of 0.8, which is maintained for 10 minutes and in this way deposition takes place of a 0.5 µm thick (Ti,Al)N layer, whereof the aluminium percentage is approximately 60%.

At the end of this phase, at time t=15 minutes, there is a rapid decrease in the ammonia flow rate, so as to obtain a $NH_3:H_2$ molar ratio of once again 0.1, followed by the deposition, in a third phase and for 5 minutes, of a 0.2 µm thick, pure TiN layer.

Then, in a fourth and a fifth phases, depositions take place of (Ti,Al)N and then TiN, in the same way as for the previously deposited layers.

It is stressed that the deposition of said complex coating having several layers takes place in a relatively short time and without stopping.

The coating deposited in this way on the substrate has excellent properties, e.g. a good behaviour in anti-wear, oxidation-resistance or corrosion-resistance applications, as well as a good hardness.

We claim:

1. A process for preparing a multilayer coating on a substrate comprising a stack of at least two different layers, each layer selected from the group consisting of titanium nitride and aluminum titanium nitride, said process comprising continuously and in a single operation applying said multilayer coating on said substrate in an enclosure, wherein each layer of said multilayer coating is formed by chemical vapor deposition from a gaseous mixture comprising hydrogen, titanium chlorides, aluminum chlorides, and a reducing gas selected from the group consisting of nitrogen and ammonia, wherein said titanium chlorides and aluminum chlorides are obtained by chlorination of a single charge of titanium and aluminum alloy, and wherein the reducing gas to hydrogen molar ratio in the gaseous mixture is modified for each layer so that the amount of aluminum in each said layer of said multilayer coating is varied, thereby producing either said titanium nitride when no aluminum is provided in the layer by said modification of said reducing gas to hydrogen molar ratio or said aluminum titanium nitride when aluminum is provided in the layer by said modification of said reducing gas to hydrogen molar ratio.

2. Process according to claim 1, wherein the reducing gas to hydrogen molar ratio in the gaseous mixture is 0.01 to 1.

3. Process according to claim 1, wherein the gaseous mixture also incorporates a vector gas selected from the group consisting of argon, helium, and mixtures thereof.

4. Process according to claim 1, wherein the process is performed at a pressure of $10^2$ to $10^5$ Pa.

5. Process according to claim 1, wherein the titanium and aluminium chlorides are $AlCl_3$ and $TiCl_3$.

6. Process according to claim 1, wherein the substrate to be coated is raised to a temperature of 700 to 1400 K.

7. Process according to claim 1, wherein in each layer, the aluminum proportion, based on the amount of aluminum and titanium in the layer, is from 0 to 60%.

8. Process according to claim 1, wherein the multilayer coating has 2 to 1000 layers.

9. Process according to claim 1, wherein each layer has a thickness of 0.02 to 0.5 µm.

10. Process according to claim 1, wherein the coating has a total thickness of 1 to 50 µm.

11. Process according to claim 1, wherein prior to or following the deposition operation, a thermochemical treatment takes place in said enclosure.

12. Process according to claim 11, wherein said thermochemical treatment is selected from the group consisting of thermal nitriding, chemical nitriding and carburizing.

13. Process according to claim 1, wherein the reducing gas to hydrogen molar ratio is modified such that the amount of aluminum in said aluminum titanium nitride varies progressively and continuously through the thickness of at least part of said multilayer coating so as to form a composition gradient layer.

* * * * *